United States Patent
Shibata et al.

(10) Patent No.: US 9,979,154 B2
(45) Date of Patent: May 22, 2018

(54) SEMICONDUCTOR LASER DEVICE

(71) Applicant: KOITO MANUFACTURING CO., LTD., Minato-ku, Tokyo (JP)

(72) Inventors: Yuichi Shibata, Shizuoka (JP); Mitsuyuki Mochizuki, Shizuoka (JP); Masashi Tatsukawa, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days. days.

(21) Appl. No.: 15/519,338

(22) PCT Filed: Oct. 8, 2015

(86) PCT No.: PCT/JP2015/078690
§ 371 (c)(1),
(2) Date: Apr. 14, 2017

(87) PCT Pub. No.: WO2016/060069
PCT Pub. Date: Apr. 21, 2016

(65) Prior Publication Data
US 2017/0244217 A1    Aug. 24, 2017

(30) Foreign Application Priority Data
Oct. 15, 2014    (JP) .................... 2014-210996

(51) Int. Cl.
*H01S 3/04*    (2006.01)
*H01S 5/024*    (2006.01)
*H01S 5/022*    (2006.01)

(52) U.S. Cl.
CPC ...... *H01S 5/02476* (2013.01); *H01S 5/02236* (2013.01); *H01S 5/02244* (2013.01);
(Continued)

(58) Field of Classification Search
CPC ............. H01S 5/02236; H01S 5/02296; H01S 5/02469; H01S 5/02476; H01S 5/02244; H01S 5/022; H01S 5/024
See application file for complete search history.

(56) References Cited

U.S. PATENT DOCUMENTS

2002/0100914 A1    8/2002  Yoshida
2003/0038290 A1    2/2003  Aizawa et al.
(Continued)

FOREIGN PATENT DOCUMENTS

JP    6-295459 A    10/1994
JP    2002-84027 A    3/2002
(Continued)

OTHER PUBLICATIONS

International Search Report dated Dec. 22, 2015 issued by International Searching Authority in counterpart International Application No. PCT/JP2015/078690 (PCT/ISA/210).
(Continued)

*Primary Examiner* — Kinam Park
(74) *Attorney, Agent, or Firm* — Sughrue Mion, PLLC

(57) ABSTRACT

Provided is a semiconductor laser device having enhanced heat dissipation properties. A semiconductor laser device 10 comprises a stem 11, a cap 12 that is attached to an upper surface of the stem 11, a semiconductor laser element 13, and a power-feeding member 14 that is at least partially buried in the stem 11. The power-feeding member 14 comprises an element-side terminal 32 that is electrically connected to the semiconductor laser element 13, and an external terminal 33. The external terminal 33 of the power-feeding member 14 is exposed on a side surface or the upper surface of the stem 11, and an attaching surface 11b that is attached to a mounting object is provided in a lower surface of the stem 11.

8 Claims, 8 Drawing Sheets

(52) U.S. Cl.
CPC ...... *H01S 5/02296* (2013.01); *H01S 5/02469* (2013.01); *H01S 5/022* (2013.01); *H01S 5/024* (2013.01)

(56) References Cited

U.S. PATENT DOCUMENTS

| | | | |
|---|---|---|---|
| 2004/0089865 A1* | 5/2004 | Arthur | H01L 31/0203 257/79 |
| 2007/0086494 A1* | 4/2007 | Shoji | H01S 5/02212 372/36 |
| 2017/0051884 A1* | 2/2017 | Raring | H01S 5/02236 |

FOREIGN PATENT DOCUMENTS

| | | |
|---|---|---|
| JP | 2002-324934 A | 11/2002 |
| JP | 2003-23202 A | 1/2003 |
| JP | 2004-349320 A | 12/2004 |
| JP | 2010-10415 A | 1/2010 |
| JP | 2011-18800 A | 1/2011 |
| JP | 5347231 B2 | 11/2013 |

OTHER PUBLICATIONS

Written Opinion dated Dec. 22, 2015 issued by International Searching Authority in counterpart International Application No. PCT/JP2015/078690 (PCT/ISA/237).

* cited by examiner

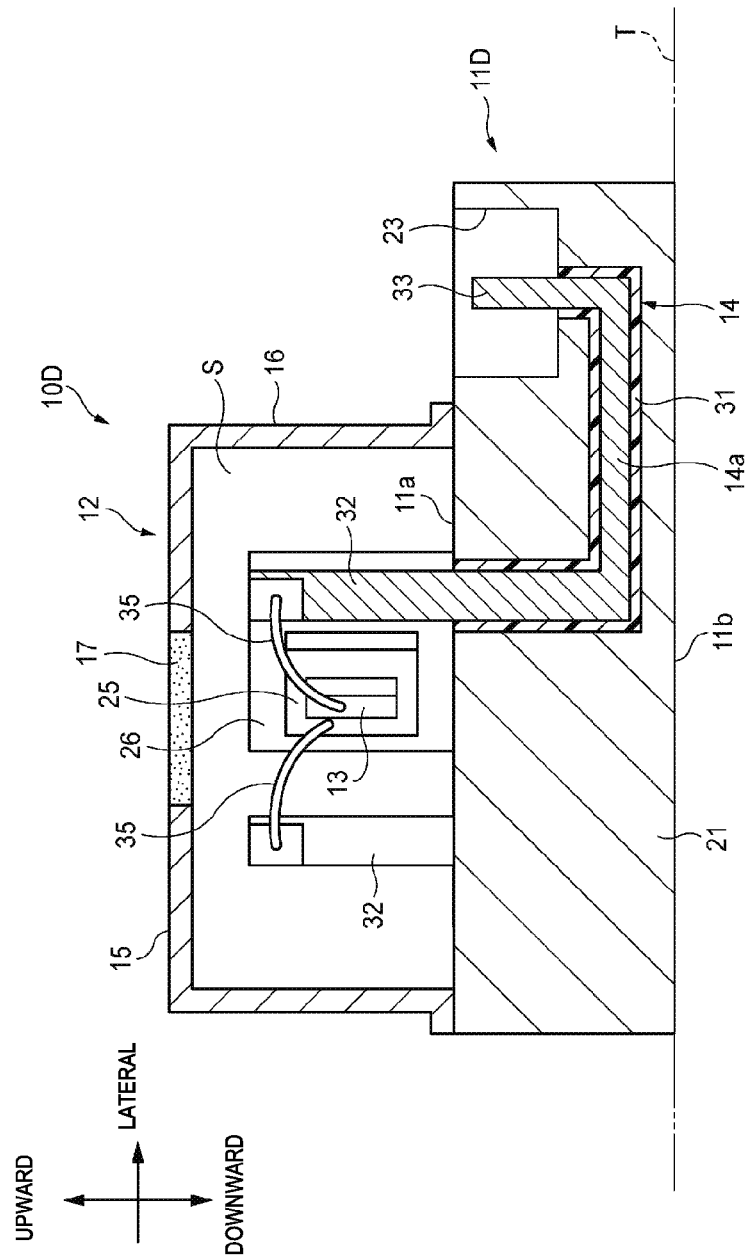

SEMICONDUCTOR LASER DEVICE

TECHNICAL FIELD

The present invention relates to a semiconductor laser device.

BACKGROUND ART

A semiconductor laser device in which a semiconductor laser element is fixed to a stem and covered with a cap is known in Patent Document 1 or the like. Such a semiconductor laser device is mounted and used in a mounting object such as an image display device, a lighting fixture or a vehicle lamp. The semiconductor laser device disclosed in the Patent Document 1 emits laser light upward through a translucent member provided on an upper surface of the cap.

CITATION LIST

Patent Document

Patent Document 1: Japanese Patent Publication No. 5347231

DISCLOSURE OF INVENTION

Problems to be Solved by Invention

In such a semiconductor laser device, it is required to dissipate heat generated in the semiconductor laser element to the outside during laser oscillation. However, the semiconductor laser device disclosed in the Patent Document 1 has room for improvement in heat dissipation properties.

It is therefore an object of the present invention to provide a semiconductor laser device with enhanced heat dissipation properties.

Means for Solving the Problems

A semiconductor laser device according to the present invention is mounted on a mounting object. The semiconductor laser device includes a stem;

a cap that has a translucent member and is attached to an upper surface of the stem to form an accommodation space between the cap and the stem;

a semiconductor laser element that is disposed in the accommodation space and emits laser light; and a power-feeding member that is at least partially buried in the stem and is electrically conducted with the semiconductor laser element, in which the power-feeding member has an element-side terminal that is exposed to the accommodation space and is electrically connected to the semiconductor laser element, and an external terminal connected to an external power source, and in which the external terminal of the power-feeding member is exposed on a side surface or an upper surface of the stem, and an attaching surface to be attached to the mounting object is provided on a lower surface of the stem.

According to the semiconductor laser device having the above configuration, the external terminal is exposed on the side surface or upper surface of the stem, and thus, it is possible to secure a large attaching surface on the lower surface of the stem. Since it is easy to efficiently transfer the heat, which is transferred from the semiconductor laser element to the stem, to the mounting object via the attaching surface, it is possible to provide the semiconductor laser device with enhanced heat dissipation properties.

In the semiconductor laser device of the present invention, a recessed portion may be provided on the side surface of the stem, and the external terminal may be exposed to the recessed portion. According to the semiconductor laser device having the above configuration, the external terminal is provided at a position retracted from an outer surface, and thus, the breakage of the external terminal can be suppressed.

In the semiconductor laser device of the present invention, a plurality of the power-feeding members may be provided, and the external terminal of at least one thereof may be exposed on the side surface of the stem at a position different from the other external terminals, as seen from above.

According to the semiconductor laser device having the above configuration, it is easy to arrange the power-feeding members so as to be spaced apart from each other, as seen from above, and heat is less likely to concentrate on a specific area. Thus, it is easy to enhance the heat dissipation properties.

In the semiconductor laser device of the present invention, the semiconductor laser element may be provided on a heat sink fixed to the upper surface of the stem, and an auxiliary conductor having one end connected to the heat sink and the other end exposed on the side surface of the stem may be buried in the stem.

According to the semiconductor laser device having the above configuration, the heat generated in the semiconductor laser element and transferred to the heat sink is transferred to the stem via the auxiliary conductor, so that the heat can be efficiently transferred from the attaching surface of the stem to the mounting object.

In the semiconductor laser device of the present invention, a positioning portion for positioning the stem on the mounting object may be provided in at least one of the side surface and the lower surface of the stem.

According to the semiconductor laser device having the above configuration, it is easy to align the semiconductor laser device at the time of being attached to the mounting object.

In the semiconductor laser device of the present invention, the external terminal may be located in the positioning portion. According to the semiconductor laser device having the above configuration, an operation of connecting the external terminal to the external power source can be accurately performed by using the portion which is easy to align.

In the semiconductor laser device of the present invention, the power-feeding member may have a heat dissipation portion extending along the attaching surface of the stem.

According to the semiconductor laser device having the above configuration, the heat generated from the semiconductor laser element and transferred to the power-feeding member can be efficiently transferred to the attaching surface via the heat dissipation portion.

In the semiconductor laser device of the present invention, a portion of the power-feeding member buried in the stem and the external terminal may extend in the same linear shape. According to the semiconductor laser device having the above configuration, it is easy to manufacture the power-feeding member.

Effects of Invention

According to the present invention, it is possible to provide the semiconductor laser device with enhanced heat dissipation properties.

BRIEF DESCRIPTION OF DRAWINGS

FIG. 3A is a sectional view taken along a line III-III in FIG. 2, and FIG. 3B is a sectional view taken along a line b-b in FIG. 3(B).

FIG. 8 is a sectional view showing a semiconductor laser device according to a fifth embodiment of the present invention.

EMBODIMENT FOR CARRYING OUT INVENTION

Hereinafter, an example of an embodiment of a semiconductor laser device according to the present invention will be described with reference to the drawings.

First Embodiment

First, a semiconductor laser device according to a first embodiment is described.

Figure 1:
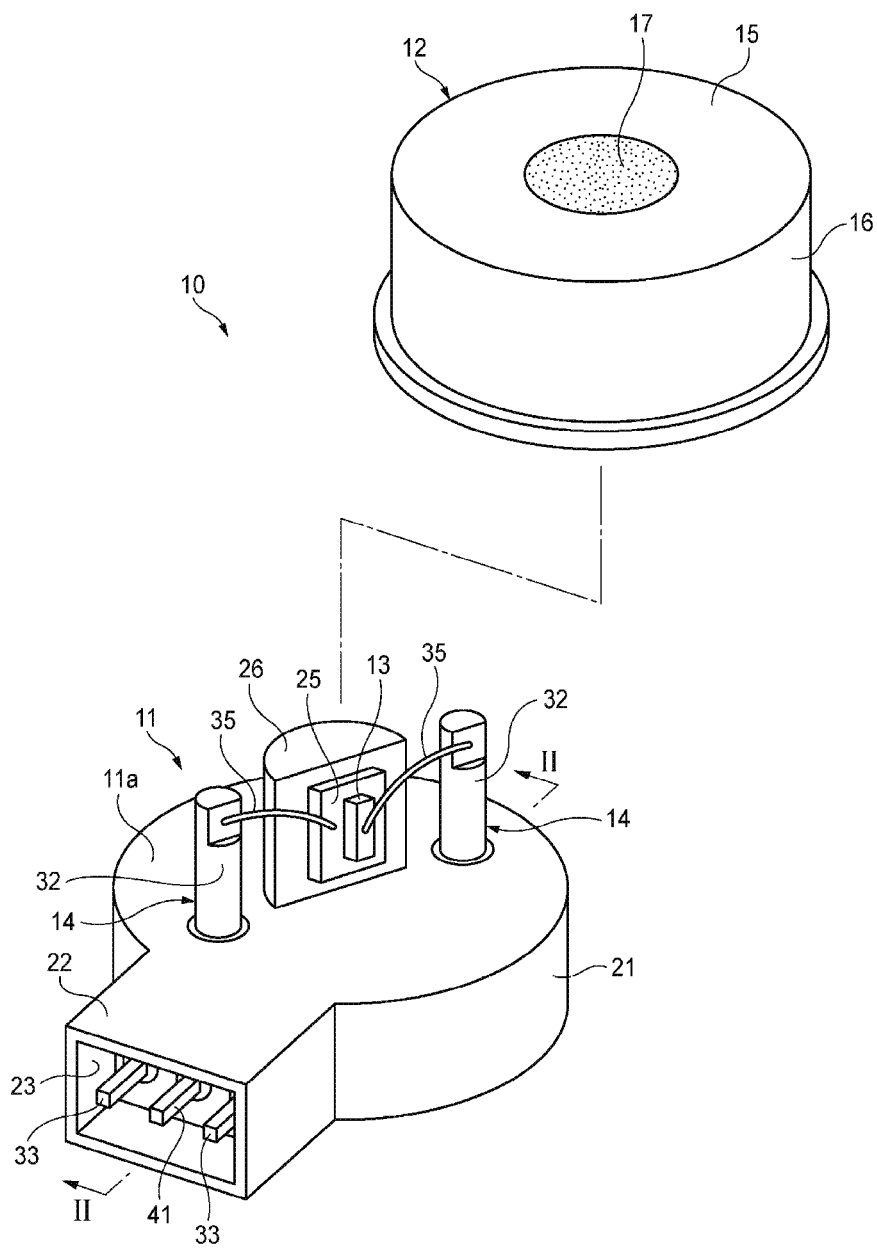
FIG. 1 is a perspective view of a semiconductor laser device according to a first embodiment of the present invention.
Figure 2:
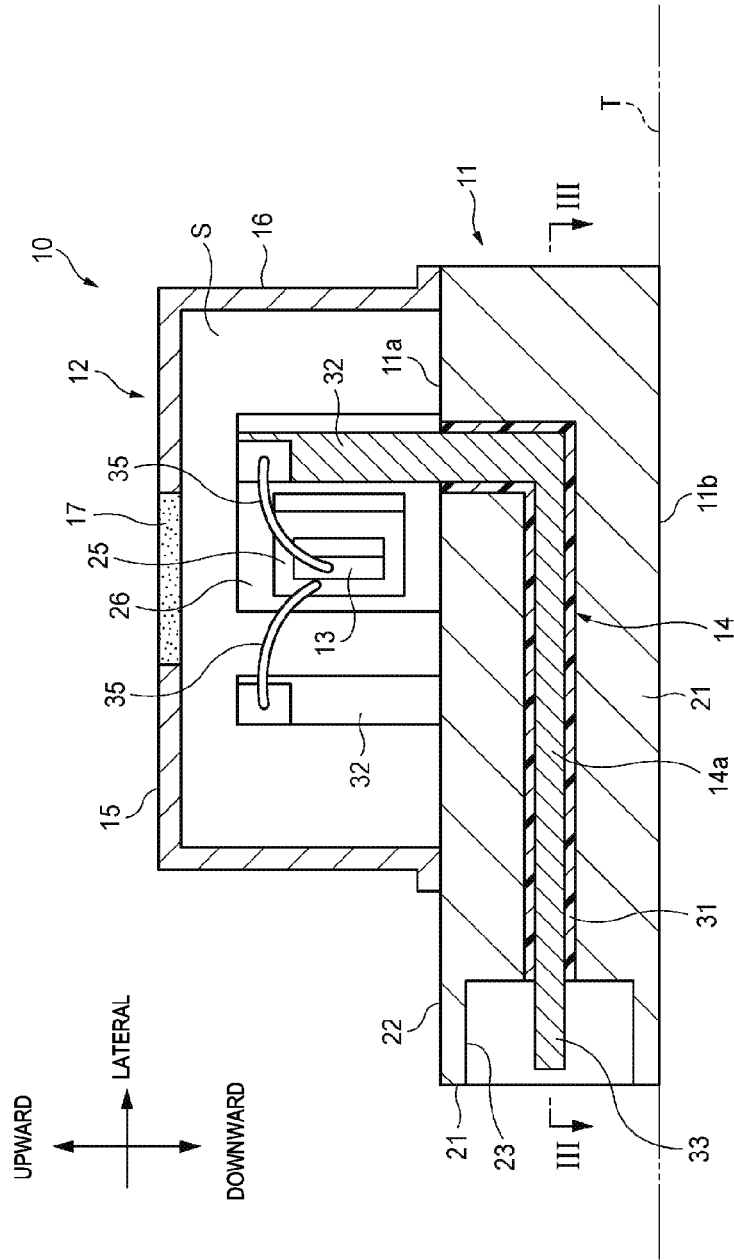
FIG. 2 is a sectional view taken along a line II-II in FIG. 1.

FIG. 1 is a perspective view of a semiconductor laser device 10 according to the first embodiment of the present invention. FIG. 2 is a sectional view taken along a line II-II in FIG. 1.

As shown in FIGS. 1 and 2, the semiconductor laser device 10 according to the first embodiment includes a stem 11, a cap 12, a semiconductor laser element 13, and a power-feeding member 14. The semiconductor laser device 10 is mounted and used in a mounting object T such as, for example, an image display device, a lighting fixture or a vehicle lamp.

The cap 12 is attached to an upper surface of the stem 11. The cap 12 has a disc-shaped upper surface portion 15 and a cylindrical peripheral wall portion 16 extending downward from a peripheral edge of the upper surface portion 15. The cap 12 is attached to the upper surface of the stem 11 to form an accommodation space S (see FIG. 2) between the cap 12 and the stem 11. The cap 12 has a translucent member 17 at a center portion of the upper surface portion 15. The translucent member 17 is formed of a material having translucency. In the present embodiment, the translucent member 17 contains a phosphor. Meanwhile, the translucent member 17 may be provided on a side surface portion or the like of the cap 12 other than the upper surface portion 15.

Meanwhile, in the following description, as shown in FIG. 2, in the semiconductor laser device 10, a direction in which the semiconductor laser element 13 is provided with respect to the stem 11 is referred to as an upper direction, a direction in which the stem 11 is provided with respect to the semiconductor laser element 13 is referred to as a lower direction, and a direction orthogonal to the upper and lower direction is referred to as a lateral direction.

The stem 11 includes a mounting portion 21 having a circular shape in a plan view and a positioning portion 22 protruding sideways from a part of the periphery of the mounting portion 21 and having a rectangular shape in a plan view. The positioning portion 22 is used for positioning the semiconductor laser device 10 with respect to the mounting object T when the semiconductor laser device 10 is attached to the mounting object T. For example, the positioning portion 22 is formed in a shape to be fitted into a recessed portion or the like formed in the mounting object T.

Of the upper surface of the stem 11, an upper surface of the circular mounting portion 21 is a mounting surface 11a. Of the lower surface of the stem 11, a lower surface of the mounting portion 21 and a lower surface of the positioning portion 22 are provided as an attaching surface 11b. The mounting surface 11a and the attaching surface 11b are formed as a flat surface, respectively.

As shown in FIGS. 1 and 2, the cap 12, the semiconductor laser element 13, a submount 25 and a heat sink 26 are mounted on the mounting surface 11a of the stem 11.

The semiconductor laser element 13 is a semiconductor element that emits laser light when power is supplied. The semiconductor laser element 13 is provided in the accommodation space S so as to irradiate laser light toward the translucent member 17.

In the present embodiment, the semiconductor laser element 13 emits blue light. The blue light causes the phosphor contained in the translucent member 17 to emit yellow light. In this way, the semiconductor laser device 10 mixes the blue light and the yellow light and emits white light to the outside.

The semiconductor laser element 13 is fixed to the sub-mount 25. The sub-mount 25 is attached to the heat sink 26 fixed to the mounting surface 11a of the stem 11. In this way, the semiconductor laser element 13 is mounted on the mounting surface 11a of the stem 11 via the sub-mount 25 and the heat sink 26.

The semiconductor laser device 10 includes a plurality of (in this example, two) power-feeding members 14. Each power-feeding member 14 is a member made of a conductive metal. Both ends of each power-feeding member 14 are formed as an element-side end portion 32 and an external terminal 33, respectively. An intermediate portion of each power-feeding member 14 is buried in the stem 11. An outer periphery of the portion of each power-feeding member 14 buried in the stem 11 is covered with an insulator 31 that is made of an insulating resin. Each power-feeding member 14 is bent at a substantially right angle in the intermediate portion thereof. The element-side terminal 32 and the external terminal 33 of each power-feeding member 14 are exposed from the insulator 31.

The element-side terminal 32 of each power-feeding member 14 protrudes from the mounting surface 11a of the stem 11 and is exposed to the accommodation space S. Each element-side terminal 32 is disposed in the vicinity of the heat sink 26 on which the semiconductor laser element 13 is supported. Each element-side terminal 32 is electrically connected to the semiconductor laser element 13 by a bonding wire 35.

The external terminal 33 of each power-feeding member 14 is exposed on the side surface of the stem 11. Specifically, a recessed portion 23 opened toward the side is provided on the side surface of the positioning portion 22 of the stem 11. Each external terminal 33 is exposed to the recessed portion 23. The external terminal 33 of each power-feeding member 14 exposed to the recessed portion 23 is connected to an external power source (not shown). In this way, power can be supplied from the external power source to the semiconductor laser element 13 via the power-feeding members 14.

Each external terminal 33 extends in the same linear shape as the portion of each power-feeding member 14 buried in the stem 11. When each power-feeding member 14 is manufactured, processing becomes easy since it has only one bent place.

Figure 3:
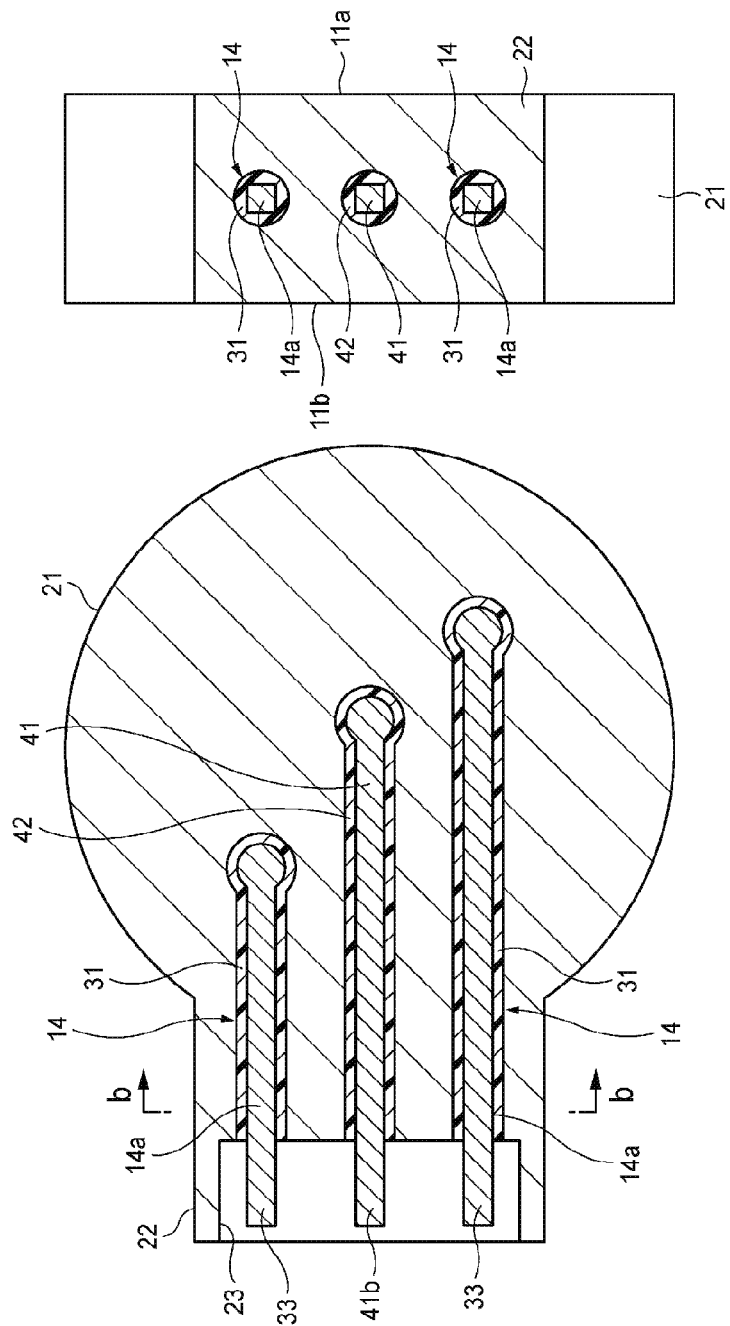
FIGS. 3A and 3B are views showing a structure of a stem.

FIG. 3 is a view showing a structure of the stem 11. FIG. 3A is a sectional view taken along a line III-III in FIG. 2, and FIG. 3B is a sectional view taken along a line b-b in FIG. 3(A).

As shown in FIGS. 3A and 3B, the plurality of power-feeding members 14 are arranged at intervals so as not to overlap with each other, as seen from above. Further, the external terminals 33 of the power-feeding members 14 are exposed to the single recessed portion 23 provided on the side surface of the stem 11.

Since the external terminals 33 are provided at positions retracted from the outer surface, the breakage of the external terminals 33 can be suppressed. Further, since the plurality of external terminals 33 are intensively provided in the single recessed portion 23, it is easy to reduce the size of the semiconductor laser device 10 and it is also easy to connect the external terminals 33 and the external power source.

Furthermore, since the external terminals 33 are positioned in the positioning portion 22, it is easy to accurately perform an operation of connecting the external terminals 33 to the external power source by using the positioning portion 22 which is easy to align.

Further, the semiconductor laser device 10 includes an auxiliary conductor 41. The auxiliary conductor 41 is a metal member having better thermal conductivity than resin. The auxiliary conductor 41 electrically connects the semiconductor laser element 13 and an external ground terminal. One end of the auxiliary conductor 41 is connected to the heat sink 26 and the other end 41b thereof is exposed on the side surface of the stem 11. The other end 41b of the auxiliary conductor 41 is exposed to the recessed portion 23 formed in the positioning portion 22. The auxiliary conductor 41 is arranged between two power-feeding members 14 and in parallel with the power-feeding members 14.

An intermediate portion of the auxiliary conductor 41 is bent at a substantially right angle. The intermediate portion of the auxiliary conductor 41 is buried in the stem 11. An outer periphery of the portion of the auxiliary conductor 41 buried in the stem 11 is covered with an insulator 42 that is made of an insulating resin.

In the semiconductor laser device 10 having the above configuration, when power is supplied from the external power source, the power is supplied to the semiconductor laser element 13 through the power-feeding members 14. Then, blue laser light is irradiated upward from the semiconductor laser element 13 and is incident on the translucent member 17. Then, yellow light is emitted from the phosphor contained in the translucent member 17. The blue light and the yellow light are mixed, and thus, white light is emitted to the outside.

When laser light is emitted from the semiconductor laser element 13 in this way, the semiconductor laser element 13 generates heat. In the semiconductor laser device 10, it is required to promptly discharge the heat generated in the semiconductor laser element 13 in order to maintain good light-emission performance of the semiconductor laser element 13. According to the semiconductor laser device 10 of the present embodiment, the heat of the semiconductor laser element 13 is transferred to the mounting object T via the sub-mount 25, the heat sink 26 and the stem 11, so that the semiconductor laser element 13 is cooled.

Here, in the case where the semiconductor laser device disclosed in the Patent Document 1 is mounted on a mounting object such as, for example, a display device, a lighting fixture or a vehicle lamp, a lower surface of the stem is fixed to the mounting object. By the way, an external terminal is exposed on the lower surface of the stem of the semiconductor laser device disclosed in the Patent Document 1. Therefore, it is necessary to secure an area for exposing the external terminal on the lower surface of the stem, and hence, an area on the lower surface of the stem, which can be used as the attaching surface, is limited. Therefore, it is difficult to efficiently transfer the heat, which is generated in the semiconductor laser element and transferred to the stem, to the mounting object via the attaching surface. For these reasons, the semiconductor laser device disclosed in the Patent Document 1 has room for improvement in heat dissipation properties.

On the contrary, according to the semiconductor laser device 10 of the present embodiment, the external terminal 33 of each power-feeding member 14 is exposed on the side surface of the stem 11. Therefore, it is possible to secure the large attaching surface 11b on the lower surface of the stem 11, and hence, it is easy to efficiently transfer the heat, which is transferred from the semiconductor laser element 13 to the stem 11, to the mounting object T via the attaching surface 11b. In this way, it is possible to provide the semiconductor laser device 10 with enhanced heat dissipation properties.

Further, according to the semiconductor laser device 10 of the above-described embodiment, the heat generated in the semiconductor laser element 13 can be efficiently transferred to the stem 11 via the power-feeding members 14 that are made of metal having higher thermal conductivity than resin. Furthermore, the plurality of power-feeding members 14 are arranged so as not to overlap with each other, as seen from above. Therefore, the heat, which is transferred from the semiconductor laser element 13 to the stem 11, is more likely to be uniformly transferred to the stem 11, as seen from above, and hence, the heat is less likely to concentrate only on a specific area of the lower surface of the stem 11. In this way, it is possible to efficiently transfer the heat from the attaching surface 11b of the stem 11 to the mounting object T.

Further, the portion of each power-feeding member 14 buried in the stem 11 extends along the attaching surface 11b of the stem 11 and also serves as a heat dissipation portion 14a. The power-feeding members 14 allow the heat generated in the semiconductor laser element 13 to be efficiently transferred to the portion close to the attaching surface 11b of the stem 11, so that the heat can be efficiently dissipated from the attaching surface 11b of the stem 11 to the mounting object T.

Further, the semiconductor laser device 10 according to the above-described embodiment includes the auxiliary conductor 41. The heat generated in the semiconductor laser element 13 is efficiently transferred to the stem 11 via the auxiliary conductor 41, in addition to the power-feeding members 14. Therefore, heat can be efficiently dissipated from the attaching surface 11b of the stem 11 to the mounting object T.

Further, since the attaching surface 11b of the stem 11 is formed as a flat surface, the attaching surface 11b is easily brought into close contact with the mounting surface T, and hence, it is easy to enhance the heat dissipation properties. Meanwhile, when the mounted surface of the mounting object T is a curved surface or a stepped surface, it is preferable that the attaching surface 11b of the stem 11 also has a shape matching the shape of the mounted surface.

Next, semiconductor laser devices 10A to 10C according to second to fourth embodiments whose configurations are partially different from those of the semiconductor laser device 10 according to the first embodiment will be described. Meanwhile, the same components as those of the first embodiment are denoted by the same reference numerals and description thereof is omitted.

Second Embodiment

In the semiconductor laser device 10 according to the first embodiment, the power-feeding members 14 are arranged so as not to overlap with each other, as seen from above. However, the present invention is not limited thereto.

Figure 4:
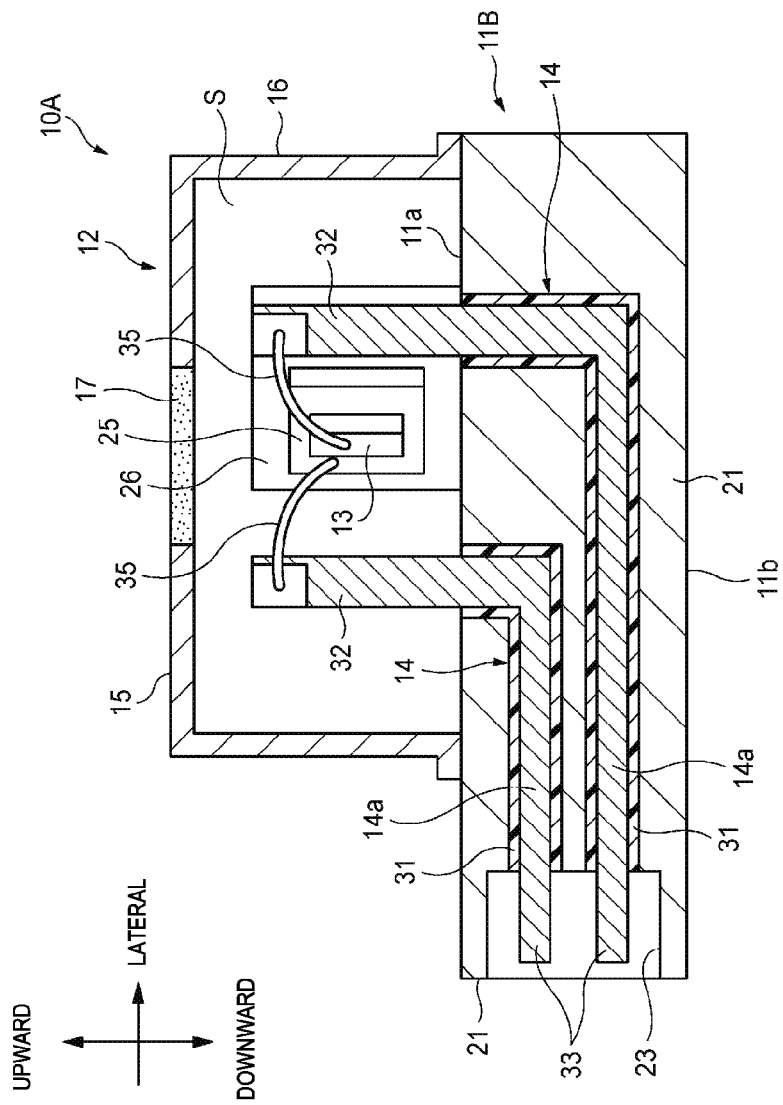
FIG. 4 is a sectional view showing a semiconductor laser device according to a second embodiment of the present invention.

FIG. 4 is a sectional view corresponding to FIG. 2, showing the semiconductor laser device 10A according to the second embodiment of the present invention.

As shown in FIG. 4, the semiconductor laser device 10A according to the second embodiment is configured such that the portions of the plurality of power-feeding members 14 buried in the stem 11 are arranged in a thickness direction of the stem 11. In this way, the external terminals 33 exposed to the recessed portion 23 are arranged above and below in the recessed portion 23. According to this configuration, a width dimension of the positioning portion 22 of the stem 11 becomes small as seen from above, thereby easily reducing the whole size thereof.

Third Embodiment

Meanwhile, in the semiconductor laser device 10 according to the above-described first embodiment, an example in which a plurality of external terminals 33 is exposed to the single recessed portion 23 has been described. However, the present invention is not limited thereto.

Figure 5:
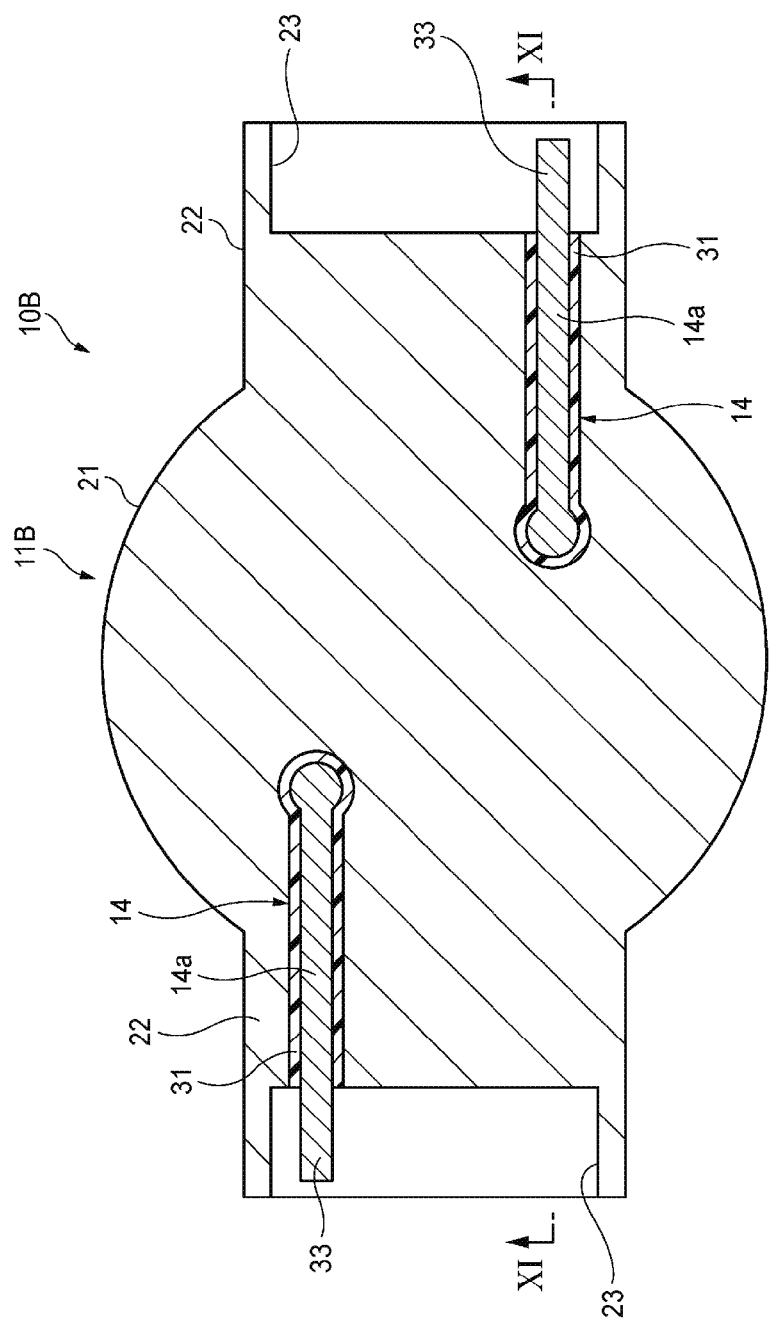
FIG. 5 is a sectional view showing a semiconductor laser device according to a third embodiment of the present invention.
Figure 6:
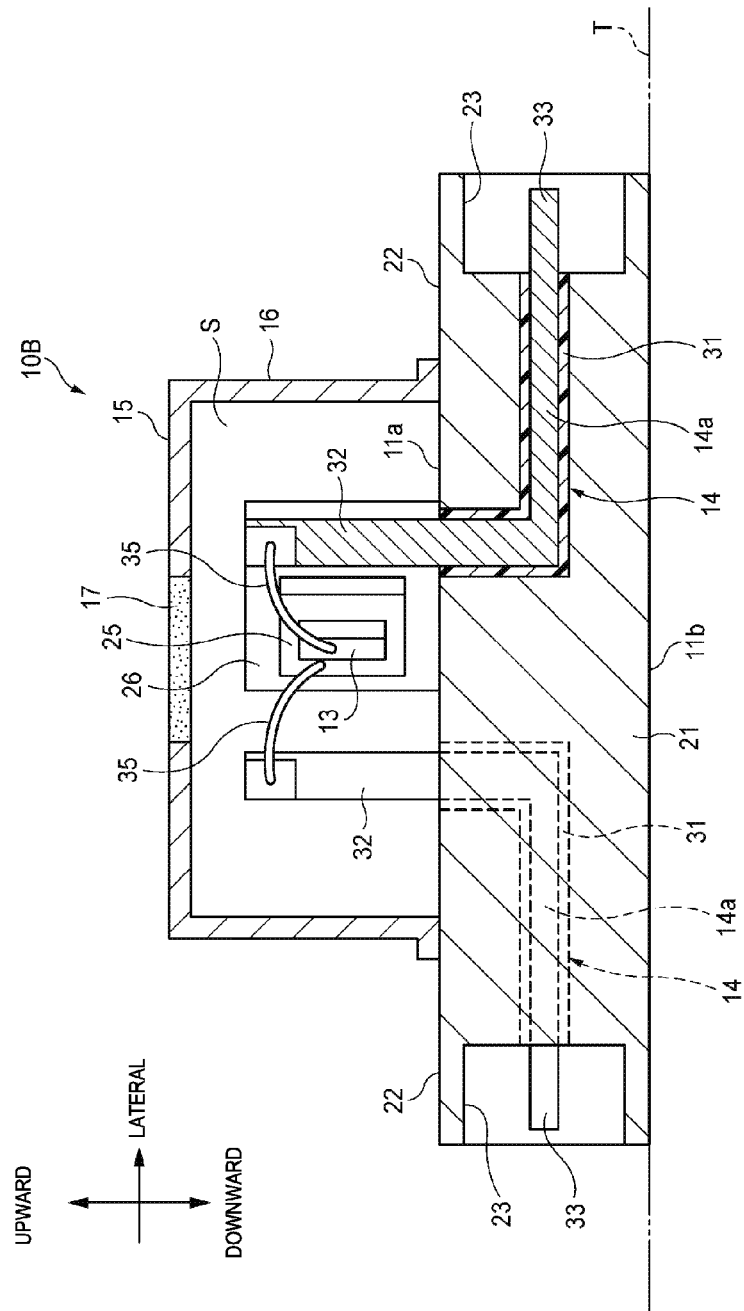
FIG. 6 is a sectional view showing the semiconductor laser device according to the third embodiment of the present invention.

FIG. 5 is a sectional view corresponding to FIG. 3A, showing the semiconductor laser device 10B according to the third embodiment of the present invention. FIG. 6 is a sectional view taken along a line XI-XI in FIG. 5.

As shown in FIGS. 5 and 6, the semiconductor laser device 10B according to the third embodiment is configured such that two positioning portions 22 are provided in a stem 11B. These positioning portions 22 are provided at positions opposite to each other, as seen from above. Each positioning portion 22 is provided with the recessed portion 23. The portions of the plurality of power-feeding members 14 buried in the stem 11B extend in opposite directions, and hence, each external terminal 33 is exposed to the recessed portion 23 of each positioning portion 22.

In this way, in the semiconductor laser device 10B according to the third embodiment, the external terminal 33 of at least one of the plurality of power-feeding members 14 is exposed on the side surface of the stem 11B at a position different from the other external terminals 33, as seen from above.

According to the semiconductor laser device 10B of the third embodiment, the external terminal 33 of at least one of the plurality of power-feeding members 14 is exposed on the side surface of the stem 11B at a position different from the other external terminals 33, as seen from above. Therefore, it is easy to arrange the power-feeding members 14 so as to be spaced apart from each other, as seen from above, and heat is less likely to concentrate on a specific area. Thus, it is easy to enhance the heat dissipation properties. Further, by providing two positioning portions 22, the semiconductor laser device can be more reliably positioned with respect to the mounting object T.

Meanwhile, in the third embodiment, the auxiliary conductor 41 is not provided. However, the auxiliary conductor 41 may be provided. Further, a terminal of the auxiliary conductor 41 exposed to the outside may be exposed on the side surface of the stem 11B at the same position as the portion to which the external terminal 33 of the power-feeding member 14 is exposed, or may be exposed on the side surface of the stem 11B at a position different from the external terminal 33, as seen from above.

Fourth Embodiment

In the above-described first to third embodiments, an example in which each power-feeding member 14 has a shape bent at a right angle has been described. However, the present invention is not limited thereto.

Figure 7:
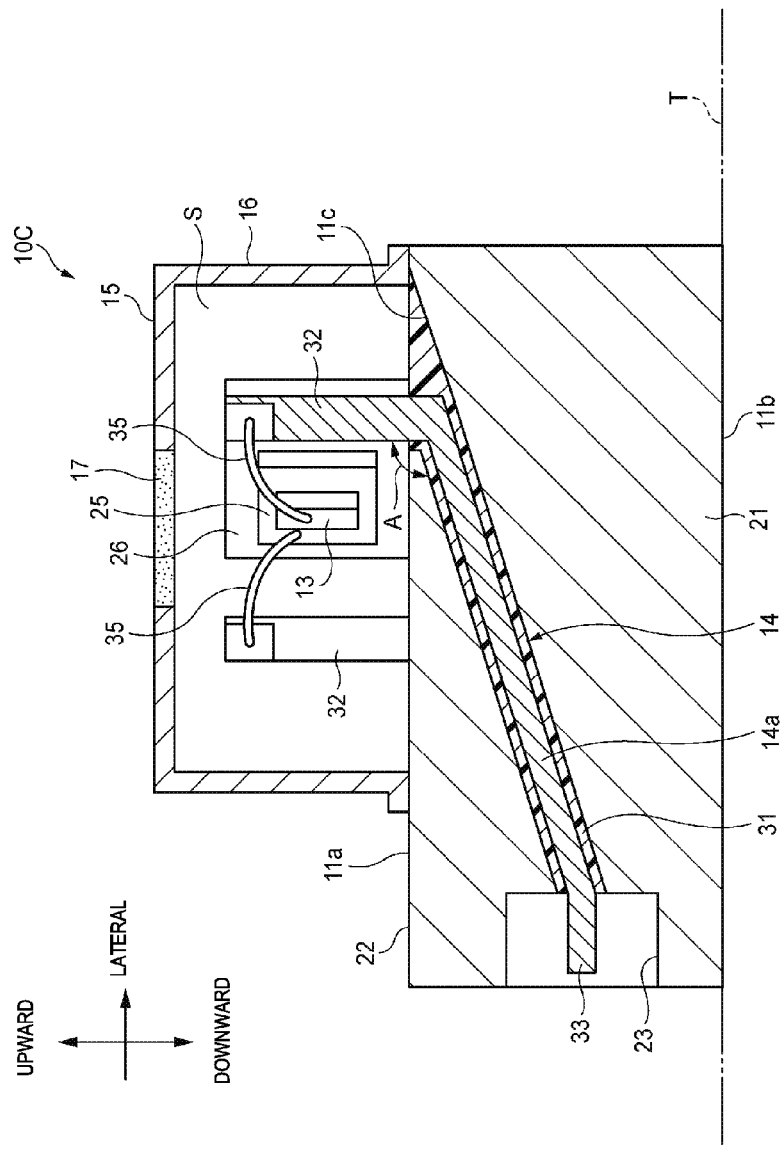
FIG. 7 is a sectional view showing a semiconductor laser device according to a fourth embodiment of the present invention.

FIG. 7 is a sectional view corresponding to FIG. 2, showing the semiconductor laser device 10C according to the fourth embodiment of the present invention.

As shown in FIG. 7, the semiconductor laser device 10C according to the fourth embodiment is configured such that a bending angle A at a bent portion in the intermediate portion of the power-feeding member 14 is an obtuse angle. The intermediate portion of the power-feeding member 14 buried in the stem 11 extends obliquely with respect to the attaching surface 11b. Further, the external terminal 33 is bent at an obtuse angle with respect to the intermediate portion and extends in parallel with the attaching surface 11b.

According to the semiconductor laser device 10C of the fourth embodiment, the bending angle of the power-feeding member 14 is an obtuse angle, and hence, an operation of bending the power-feeding member 14 can be facilitated.

Further, in the semiconductor laser device 10C according to the present embodiment, a taper portion 11c along an extension direction of the intermediate portion 14a of the power-feeding member 14 is provided in a part in a radial direction of an opening which is provided in the mounting surface 11a and into which the power-feeding member 14 is inserted. In this way, the power-feeding member 14 can be easily inserted into the stem 11 along the taper portion 11c of the opening, thereby facilitating the assembly of the semiconductor laser device 10C.

Fifth Embodiment

In the above-described first to fifth embodiments, an example in which the external terminal 33 of the power-feeding member 14 is exposed on the side surface of the stem 11 has been described. However, the present invention is not limited thereto.

FIG. 8 is a view corresponding to FIG. 2, showing a semiconductor laser device 10D according to a fifth embodiment of the present invention.

As shown in FIG. 8, the external terminal 33 of the power-feeding member 14 may be exposed on an upper surface of a stem 11D. In the semiconductor laser device 10D according to the present embodiment, the recessed portion 23 is provided in the upper surface of the stem 11D, and the external terminal 33 is exposed to the recessed portion 23. The recessed portion 23 is provided in the portion of the upper surface of the stem 11D that is not covered with the cap 12 and the external terminal 33 is exposed to the recessed portion.

According to the semiconductor laser device 10D of the present embodiment, the entire surface of the lower surface of the stem 11D is formed as the attaching surface 11b. Therefore, the heat of the semiconductor laser element 13 can be efficiently transferred to the mounting object T. Further, since the external terminal 33 is not exposed on the side, the semiconductor laser device 10D according to the present embodiment can be easily attached even when there is no attachment space in the left and right direction.

Various Modifications

Meanwhile, in the first to fourth embodiments, the entire surface of the lower surface of the stem 11 is formed as the attaching surface 11b. However, only a part of the lower surface of the stem 11 may be formed as the attaching surface 11b. Further, besides the lower surface, the side surface or the like of the stem 11 may be provided as the attaching surface in contact with the mounting object T.

Further, in each of the embodiments described above, an example in which the entire lower surface of the stem 11 is formed as a flat surface has been described. However, the present invention is not limited thereto. For example, a hole portion provided in the lower surface of the stem 11 and a convex portion provided in the mounting object T may be used for positioning the semiconductor laser device 10 with respect to the mounting object T. In this case, a region of the lower surface of the stem 11 other than the hole portion can be the attaching surface 11b.

Furthermore, in each of the embodiments described above, an example in which a single attaching surface is provided on the lower surface of the stem 11 has been described. However, the present invention is not limited thereto. For example, the lower surface of the stem 11 may be composed of two flat surfaces connected via a step. In this case, the two flat surfaces serve as the attaching surface 11b. The semiconductor laser device 10 can be positioned on the mounting object T by using the step while efficiently transferring the heat of the semiconductor laser element 13 to the mounting object T by the two flat surfaces.

Further, the shape of the stem 11 or the cap 12 is not limited to the shapes in the above embodiments, so long as the accommodation space S capable of accommodating the semiconductor laser element 13 can be formed in the mounting surface 11a of the stem 11.

Further, although an example in which one external terminal 33 is exposed from one positioning portion 22 has been described, the present invention is not limited thereto. A plurality of recessed portions 23 spaced apart from each other may be provided in one positioning portion 22, and the external terminals 33 may be exposed from respective recessed portions 23.

Meanwhile, the installation position of the positioning portion 22 is not limited to the side surface of the stem 11 but the positioning portion 22 may be provided in the lower surface of the stem. In this case, for example, by fitting the positioning portion 22 provided in the lower surface of the stem 11 into a hole portion formed in the mounting object T, the semiconductor laser device 10 can be easily positioned with respect to the mounting object T.

Furthermore, the shape of the positioning portion 22 of the stem 11 is not limited to the shapes in the above embodiments, but the positioning portion 22 may be a stepped or linear portion or an irregular or curved portion or the like corresponding to the attaching portion of the mounting object T.

Further, the semiconductor laser element 13 may be directly mounted on the mounting surface 11a of the stem 11.

The semiconductor laser element 13 is not limited to an element to emit blue light but may adopt an element to emit laser light of a desired wavelength. Further, the phosphor contained in the translucent member 17 is not limited to a phosphor to emit yellow light upon receiving blue light but may adopt a phosphor having an arbitrary composition. Furthermore, although an example in which the semiconductor laser device emits white light has been described, the semiconductor laser device is not limited thereto but may be configured to emit light of a specific wavelength.

The translucent member 17 may have a lens function of refracting laser light from the semiconductor laser element 13.

Meanwhile, the number of the semiconductor laser element 13 is not limited to one but a plurality of semiconductor laser elements 13 may be accommodated in the accommodation space S. Lens components or phosphors may be provided in the accommodation space S.

The present application is based upon Japanese Patent Application (Patent Application No. 2014-210996) filed on Oct. 15, 2014, the contents of which are incorporated herein by reference.

INDUSTRIAL APPLICABILITY

According to the present invention, it is possible to provide the semiconductor laser device with enhanced heat dissipation properties.

REFERENCE NUMERALS LIST 10, 10A, 10B, 10C: Semiconductor Laser Device, 11: Stem, 11b: Mounting Surface, 12: Cap, 13: Semiconductor Laser Element, 14: Power-feeding member, 14a: Heat dissipation Portion, 17: Translucent Member, 22: Positioning Portion, 23: Recessed Portion, 26: Heat Sink, 32: Element-side Terminal, 33: External Terminal, 41: Auxiliary Conductor, S: Accommodation Space

What is claimed is:
1. A semiconductor laser device mounted on a mounting object, comprising:
a stem;
a cap that has a translucent member and is attached to an upper surface of the stem to form an accommodation space between the cap and the stem;
a semiconductor laser element that is disposed in the accommodation space and emits laser light; and
a power-feeding member that is at least partially buried in the stem and is electrically conducted with the semiconductor laser element,
wherein the power-feeding member has an element-side terminal that is exposed to the accommodation space and is electrically connected to the semiconductor laser element, and an external terminal connected to an external power source, wherein the external terminal of the power-feeding member is exposed on a side surface or an upper surface of the stem, and an attaching surface to be attached to the mounting object is provided on a lower surface of the stem, and wherein an intermediated portion of the power-feeding member is buried in the stem and is bent.

2. The semiconductor laser device according to claim 1, wherein a recessed portion is provided on the side surface of the stem, and the external terminal is exposed to the recessed portion.

3. The semiconductor laser device according to claim 1, wherein a plurality of the power-feeding members are provided, and the external terminal of at least one thereof is exposed on the side surface of the stem at a position different from the other external terminals, as seen from above.

4. The semiconductor laser device according to claim 1, wherein the semiconductor laser element is provided on a heat sink fixed to the upper surface of the stem, and an auxiliary conductor having one end connected to the heat sink and the other end exposed on the side surface of the stem is buried in the stem.

5. The semiconductor laser device according to claim 1, wherein a positioning portion for positioning the stem on the mounting object is provided in at least one of the side surface and the lower surface of the stem.

6. The semiconductor laser device according to claim 5, wherein the external terminal is located in the positioning portion.

7. The semiconductor laser device according to claim 1, wherein the power-feeding member has a heat dissipation portion extending along the attaching surface of the stem.

8. The semiconductor laser device according to claim 7, wherein a portion of the power-feeding member buried in the stem and the external terminal extend in the same linear shape.

* * * * *